US006919515B2

(12) United States Patent
Blackshear et al.

(10) Patent No.: US 6,919,515 B2
(45) Date of Patent: Jul. 19, 2005

(54) STRESS ACCOMMODATION IN ELECTRONIC DEVICE INTERCONNECT TECHNOLOGY FOR MILLIMETER CONTACT LOCATIONS

(75) Inventors: Edmund David Blackshear, Wappinger Falls, NY (US); Thomas Mario Cipolla, Katonah, NY (US); Paul William Coteus, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 261 days.

(21) Appl. No.: 09/768,372

(22) Filed: Jan. 23, 2001

(65) Prior Publication Data

US 2001/0004943 A1 Jun. 28, 2001

Related U.S. Application Data

(63) Continuation-in-part of application No. 09/085,060, filed on May 27, 1998, now abandoned.

(51) Int. Cl.$^7$ ................................................. H05K 1/16
(52) U.S. Cl. ........................ 174/260; 257/737; 257/780; 361/768
(58) Field of Search ......................... 174/260; 361/767, 361/768, 771; 257/737, 738, 780

(56) References Cited

U.S. PATENT DOCUMENTS 5,834,848 A * 11/1998 Iwasaki ....................... 257/778
5,859,474 A    1/1999 Dordi ......................... 251/737
6,184,581 B1 * 2/2001 Cornell et al. ............... 257/737
6,229,711 B1 * 5/2001 Yoneda ....................... 361/760
6,493,238 B1 * 12/2002 Pai ............................. 361/772

* cited by examiner

Primary Examiner—Kamand Cuneo
Assistant Examiner—Jeremy Norris
(74) Attorney, Agent, or Firm—Thomas A. Beck; Daniel P. Morris

(57) ABSTRACT

The providing of an array interface of conductive joint members for use in forming interconnections between mating surfaces such as a pad on a surface mount electronic device and contacts on a circuit card where one portion of the conductive joint members are of a relatively elongated or oval outline and are oriented with the longer dimension in one direction to accommodate wiring spacing and another portion oriented in a different direction for accommodating expansion stress. In manufacturing when the relatively elongated shape is oriented with the longer dimension along the wiping motion direction in a screen type forming of the conductive joint members the slurry of material that is to be the conductive joint members fills the openings in the screen more reliably and the areas of the conductive members are more uniform. The invention provides the advantages of an increase in the number of wiring lines, an increase in uniformity of wiped screen deposition conductive joint member formation, ability to employ more than one out of chip and wiring levels in expansion mismatch stress relief, and ability by conductive joint member dimensional alignment to improve reliability and flexibility.

8 Claims, 5 Drawing Sheets

CIRCLE

AREA MOMENT OF INERTIA:
$i_{xx} = .785\ R^4\ (\pi R^4/4)$
$i_{yy} = .785\ R^4\ (\pi R^4/4)$

ELLIPSE

OVAL $i_{xx} = 1.534\ R^4$
$i_{yy} = .410\ R^4$

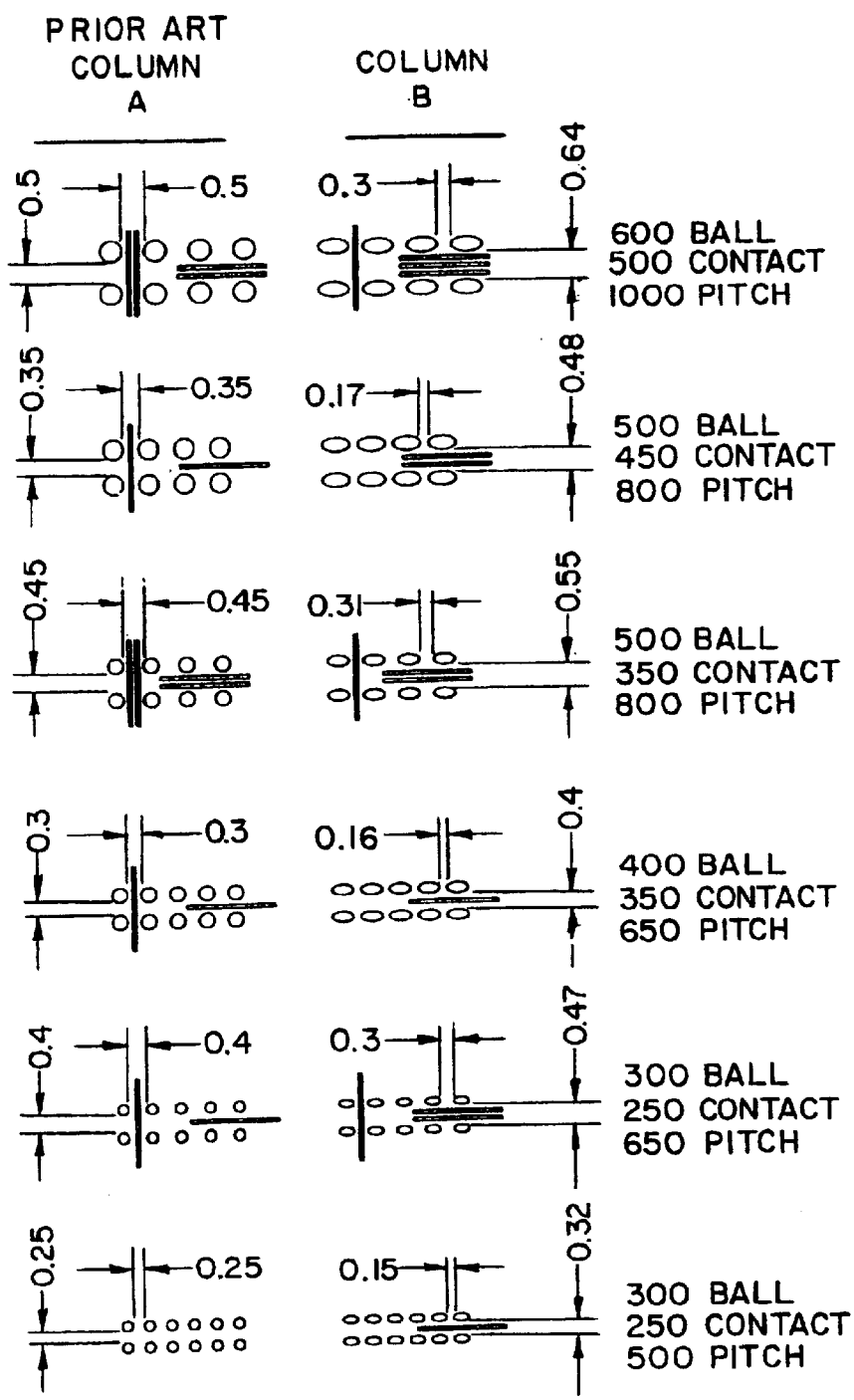

11×11
80 OUT EDGE
20 OUT VIAS
100 TOTAL

11×11
100 OUT EDGE
10 OUT VIAS
110 TOTAL

11×11
112 OUT EDGE
4 OUT VIAS
116 TOTAL 15 x 15

112 OUT EDGE
56 OUT VIAS
168 TOTAL 15 x 15

136 OUT EDGE
44 OUT VIAS
176 TOTAL

STRESS ACCOMMODATION IN ELECTRONIC DEVICE INTERCONNECT TECHNOLOGY FOR MILLIMETER CONTACT LOCATIONS

This application is a continuation in part of application Ser. No. 09/085,060 filed May 27, 1998 now abandoned.

FIELD OF THE INVENTION

The invention is directed to improving the wireability, solderability, and reliability of surface mount electronic devices where the device is retained in position by conductive joint elements that are attached to planar signal pads on a surface of the device and to planar contact locations in an area array, where there are fine contact pitch sizes of the order of 1 millimeter (mm) or less.

BACKGROUND

Electronic devices continue to become smaller, driven by requirements of portable devices and by the requirement to have smaller interconnections between devices so as to increase their speed. As a result, the distance between the pad connections of the device such as a semiconductor chip, and the wiring circuitry or printed circuit contact locations, where the device is attached to a wiring substrate, such as a printed circuit card, hereinafter the card, through conductive joints, becomes smaller and any expansion mismatch between the materials involved becomes more difficult to handle. The present downsizing trend is toward contact separations on the card that are in the sub millimeter range. The conductive joints themselves are usually small volume elements of solder or solderable metal that have been subjected to a temperature and duration processing operation known in the art as a processing window which produces reflowing into a joint between the pad and another part of the package such as the contact on the card.

The contacts on the card are usually of circular shaped metal, typically copper, to which printed conductors are attached that go to other electronic devices, interconnections or power distribution locations or planes. It is also common practice to place vias, or conducting holes, at the locations of some or all of the contacts. In this way the interconnections to the contacts may be run on internal layers of a multilayer wiring support member or card. Alternatively, contact may be made directly, to internal voltage or ground planes, of a multilayer printed circuit card.

When contact pitches approach the submillimeter range, it becomes difficult at the present state of the art to create vias in a printed circuit card for each contact and so wiring from one device to another device may be accomplished in these situations by also running fine lines between contacts, on the top layer or mounting surface of the card. As the size of the interconnections and the wiring joining them become smaller and enter the submillimeter range the effect from damage from expansion mismatch of the materials in the parts of the assembly becomes a more pressing consideration. The size of the electronic device and the number of contacts that can be reliably wired, then becomes a function of how many lines can be placed in the space between contacts. Present printed wiring techniques are in the direction of only allowing roughly a 75 micrometer line width and a 100 micrometer space to another line or surface mount contact. Such spacing imposes a severe constraint on the reliable wireability and long term reliability in service of fine pitched electronic devices.

Progress has been made in the art as described in U.S. Pat. No. 5,859,474 wherein the use of elongated or elliptical shaped pads aligned in a certain direction permits wider spacing between pads in the direction of alignment and more interwiring in those spaces.

To form the conductive joints that join the pads on the electronic devices to the contacts on the circuit card it is the standard practice to position small volume quantities of a solder paste, or a slurry of fine solder particles in a fluid, such as through a screen or a stencil onto the contacts of the printed circuit card, forming a small volume element which is then fused to the contact. The electronic device is then placed precisely with the pads on the screened fused elements on the card contacts and heated in a single or in multiple reflow operations at solder reflow temperatures where conductive joints are formed between the contacts on the card and the pads on the electronic device.

Heretofore in the art there have been two major limitations in the formation of conductive joints when the size of the contacts approach one millimeter or less. The first is that when the dimension of the contact becomes as small as one millimeter, the conductive paste in a screen stencil hole may not always separate from the bulk of the paste as it is screened, or wiped, across the depostion hole, resulting in situations where the paste is retained in the hole in the screen when the screen is lifted. The second is that, a difference in thermal coefficent of expansion of the parts involved such as between that of the device and that of the circuit card operates to produce differential motion which produces a resulting plastic deformation the effect of which on such contacts as the solder columns always being similarly concentrated so that early fatigue and ultimately joint failure occurs.

The objects of this invention are to increase wiring flexibility by increasing the number of wiring lines that can be placed between two adjacent contacts in an array where the contacts are 1 mm or less for connection in the interface between a pad on a surface mount electronic device and a contact on a circuit card; to improve the formation of conductive joint members in the depositon of conductive paste onto the contacts on a circuit card; and, to improve the reliability of those conductive joints under the stress conditions induced by thermal cycling in manufacturing and in service.

SUMMARY OF THE INVENTION

The providing of an interface array of conductive joint members for use in forming an interconnecting interface between mating surfaces such as a pad on a surface mount electronic device and contacts on a circuit card where one portion of the conductive joint members are of a relatively elongated or oval outline and are oriented with the longer dimension in one direction to accommodate wiring spacing and another portion oriented in a different direction for accommodating expansion stress. In manufacturing when the relatively elongated shape is oriented with the longer dimension along the wiping motion direction in a screen type forming of the conductive joint members the slurry of material that is to be the conductive joint members fills the openings in the screen more reliably and the areas of the conductive members are more uniform. The invention provides the advantages of an increase in the number of wiring lines, an increase in uniformity of wiped screen deposition conductive joint member formation and ability by conductive joint member dimensional alignment to improve resistance to stress damage of the conductive joints in manufacture and in later service due to expansion mismatch during thermal cycling.

BRIEF DESCRIPTION OF THE DRAWINGS

FIGS. 2, 3 and 4 are perspective depictions of the relative positioning of the first and second portions of the conductive joint members in the interface of the invention, wherein:

FIG. 2 is a perspective illustration of an interface array employing the invention using as an example elongated shaped conductive joint members, depicting interconnecting wiring placement advantages together with an example expansion mismatch accommodation conductive joint placement.

FIG. 3 is a cross sectional view taken along the lines 3—3 of FIG. 1 of a perspective depiction of the interface of the invention in which the conductive joint first portion is attached at the surface of the device and the expansion mismatch accommodating portion is attached to the card.

FIG. 4 is a perspective illustration of an interface array of the invention wherein conductive joint members going between portions of the packaging such as chip and wiring support, not shown, having elongated shaped wiring spacing accommodation contacts at one portion and vertically above having a circular shaped expansion mismatch accommodation built into a circular contact.

FIGS. 6A through 6F are illustrations in tabular form of a comparison of the wiring and spacing advantages of the elongated shaped conductive joint member in the interface of the invention as compared with standard prior art circular shaped joint members.

FIGS. 7–9 are depictions of the wireability, and expansion accommodation improvement provided with the invention in which FIG. 7 is a prior art circular conductive joint geometry layout and FIGS. 8 and 9 are elongated wiring spacing accommodating conductive joint layouts together with expansion mismatch accommodating positioning.

FIGS. 10 and 11 are depictions of the wiring improvement and expansion stress reduction of the invention in comparison with the prior art wherein, FIG. 10 is a prior art circular conductive joint geometry layout and FIG. 11 is a size comparable embodiment illustrating the combination of elongated contact increased wiring capability and expansion stress accommodation through radial positioning.

DESCRIPTION OF THE INVENTION

In accordance with the invention, in the formation of a screened conductive joint interface such as between mating surfaces of a pad on a surface mount electronic device and contacts on a wiring support member such as a printed circuit, when the pitch or centerline spacing becomes reduced to about a millimeter, expansion mismatch of the materials involved becomes a serious consideration and major benefits are achieved by using as an array interface an elongated or oval shape for the conductive joint member together with an expansion mismatch accommodating capability.

The interface of the invention may be viewed as having a contact spacing accommodation portion employing elongated conductive joints aligned to provide additional space to accommodate wiring and an expansion mismatch accommodation capability portion arranged to offset stress on the conductive joints such as would occur in thermal recycling in manufacturing or in service. The expansion mismatch capability portion is generally responsive in an orthogonal direction to the spacing alignment portion of the elongated contacts and can be achieved by similarly shaped contacts of sufficient area aligned essentially at angles to the elongated contacts and can be provided in several structurally different ways.

Figure 1:
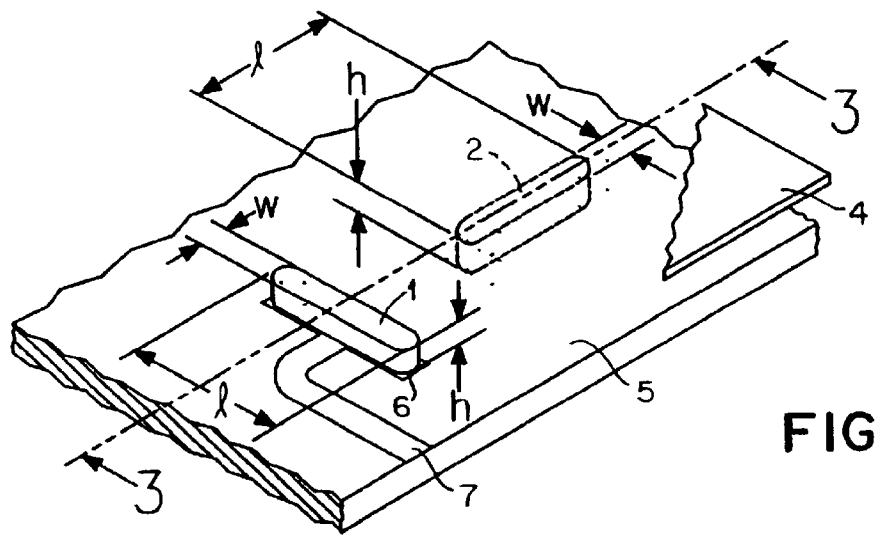
FIG. 1 is a three dimensional perspective illustration of the invention involving an example positioning of an elongated shape screened conductive joint member together with an illustration of one orientation of an expansion mismatch accommodating joint member.

Referring to FIG. 1 where there is shown a three dimensional perspective single contact illustration of the elements of the array interface of this invention made up of a wiring accommodation portion in the form of an elongated shape conductive joint member together with an expansion mismatch accommodating portion which in this illustration is an orthognally positioned conductive joint member. The conductive joint contact for the first or spacing aligned portion of the array interface of the invention, is labelled 1, and the conductive joint for the second or the expansion mismatch stress accommodating portion, is labelled 2. The conductive joints 1 and 2 are elongated in shape in that there is a longer dimension or major axis, labelled (l) and a shorter, side to side dimension or minor axis labelled (w). In FIG. 1 the conductive joint members 1 and 2 of the portions of the array interface are attached at 6 to the surface 5, over which a wiring support card 4 is positioned and which is broken away for visibility of the conductive joints on the surface 5. An example conductor 7 is shown in the surface 5 for external connection to the conductive joint 1. The accommodation for wiring benefit of the invention is achieved by aligning the conductive joint members, of which element 1 is one, along the longer, end to end, dimension (l) which operates to provide more wiring space.

The alignment of the expansion mismatch acommodating portion benefit of the invention, of which element 2 is one contact, is aligned along dimension (w), orthogonal to the alignment of the spacing accomodation portion 1. The responsiveness is proportional to the ratio of the lengths of the major and minor axes (l) and (w). The contact areas of the two portions are approximately equivalent.

The requirements of portion 2, the expansion mismatch accomodation portion can be satisfied by several structural arrangements including orthogonal conductive joint members in the array, conductive joints on the mating face of the wiring supporting member and having a different shape at the wiring support contact. The different arrangements are depicted in connection with FIGS. 2, 3 and 4.

Figure 2:
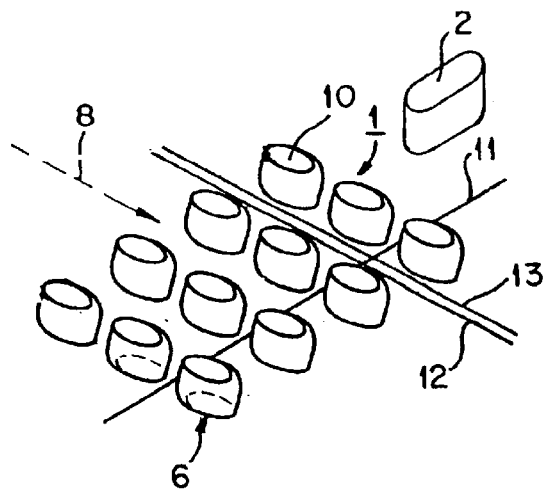

Referring to FIG. 2, where the surface mount electronic device is not shown for clarity, there is shown a depiction of a partial array of elongated shaped conductive joint members 1 contacting surface such as 5, not shown, at 6. The elongated conductive joint members 1 are shown with the dimension (l) aligned in the wipe direction 8 when filling. In the smaller spacing between rows of the array where the example interconnect wiring line 9 is shown, the longer dimension (l) of each member 1 provides room for only one interconnect line. The conductive joints contact the card above, not shown, at 10. In the larger spacing between rows of the array where the smaller dimension (w) of each member 1 provides more room, there can be a plurality of lines, such as for example the two shown, 12 and 13. Further in FIG. 2 an example elongated expansion mismatch conductive joint 2 is oriented orthogonally to alignment of the members 1.

Figure 3:
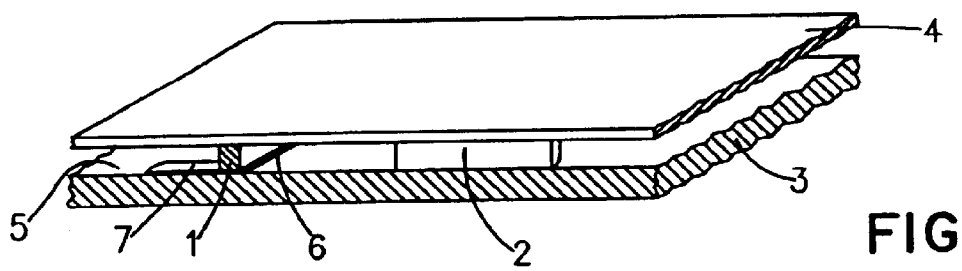

Referring to FIG. 3 which is a cross sectional view taken along the lines 3—3 of FIG. 1 the first conductive joint 1 is attached to the surface 5 and on reflow attachment to the underside of card 4 occurs. In the case of the second portion, conductive joint 2, the joint can be attached to the card initially so that on reflow attachment occurs to the surface 5. This is of particular benefit where the card and the device are different manufactured products and are brought together at reflowing.

Figure 4:
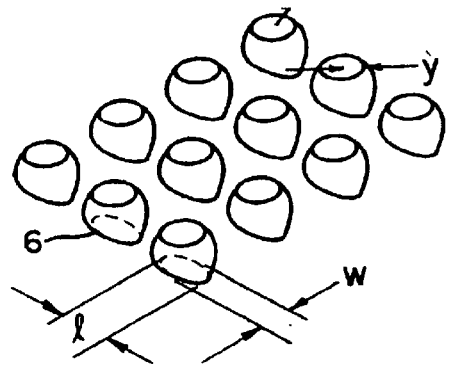

Referring next to FIG. 4 there is shown a perspective illustration of an array of the invention wherein conductive joint members going between portions of the packaging such as chip and circuit card, not shown, having example elongated (l) dimension contacts in the aligned direction and the smaller (w) dimension at right angles with the alignment, at the contacting surface portion and vertically above having a circular shaped, with radius r, expansion mismatch accommodation conductive joint 10 directly above.

The types of construction in FIGS. 3 and 4 provide a unique benefit in that where the chip is one product with the pads at 6 being of one specification supplied by one source and the wiring board contact at 10 may be from different supplier with separate specifications for the pad shapes and contacts will have little effect on each other.

In the practicing of the invention the effect of the expansion mismatch capability may be considered as providing an opposing force to any damaging force resulting from expansion mismatch of the materials so that the relative areas of the conductive joints and the expansion mismatch capability become considerations.

Figure 5A:
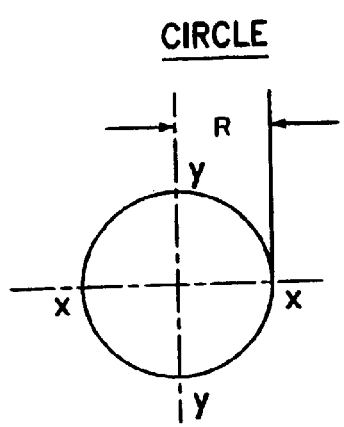
in FIG. 5A the calculations for the area moment of inertia for a circular contact, in FIG. 5 B the calculations for the area moment of inertia for an ellipsoidal contact, and, in FIG. 5C the calculations for the moment of inertia for an elongated or oval shaped contact
Figure 5B:
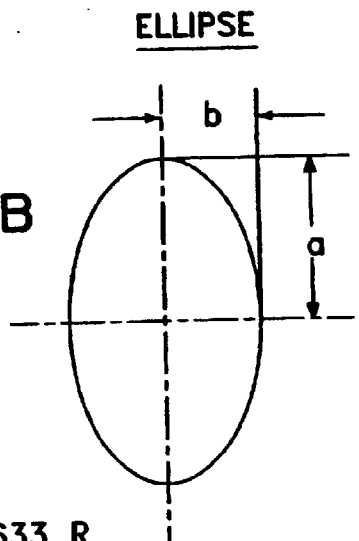
FIG. 5 illustrates area determinations for the contacting members wherein there is shown.
Figure 5C:
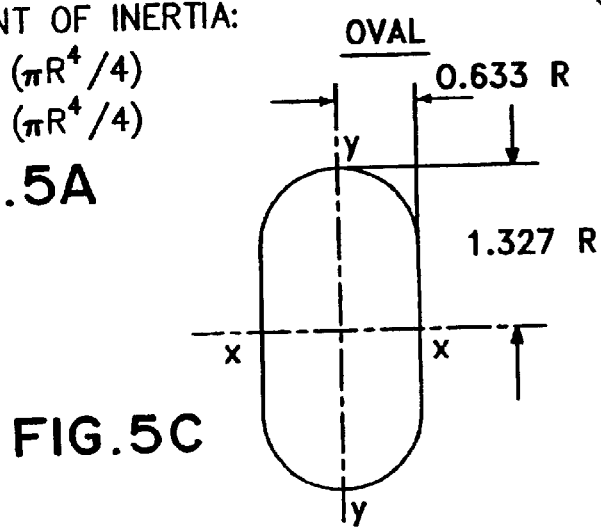

Referring next to FIG. 5 there is illustrated the geometry involved in area determinations for the circular, the ellipsoidal and the elongated or oval shaped contact contacting members, wherein in FIG. 5A calculations for the area moment of inertia for a circular contact is shown, in FIG. 5B the calculations for the area moment of inertia for an ellipsoidal contact is shown, and, in FIG. 5C the calculations for the moment of inertia for an elongated or oval shaped contact is shown. In general in practicing the invention the combined effective contact areas of the first portion of the interface of the invention should be relatively close to the combined effective contact area of the second portion of the interface of the invention.

In the formation of the screen deposited conductive joint members 1 the members are deposited through the screen with wipe strokes along the long dimension (l) and then attached and further shaped by a reflowing of the conductive material. Care is needed with an almost pointed elliptical shape that the deposited shape of the slurry does not separate and leave less than a full contact area. While under careful specifications, all reflowing can take place in a single temperature cycle the reflowing is described in two operations for explanation clarity. There is a first reflowing of the slurry volume thereby forming the elongated shape as in FIG. 1 with the slurry of metal particles coalesceing in an elongated hole in the screen stencil and being deposited in conformation with an elongated printed circuit contact location 6. Then in a second reflowing the surface 10 is fused to and conforms to the shape of the pad on the surface mount electronic device.

In manufacturing, a supporting stencil, of a type standard in the art, is positioned in contact with the printed circuit card. The stencil has a thickness that can produce the height (h) after reflowing, and is provided with openings with the dimensions (l) and (w) for each member to be formed in an array. The dimension (l) of each opening is aligned with the direction of the screening wipe. The stencil supports a slurry of low temperature melting conductive particles in a fluid where the viscosity of the slurry is such that it flows into the openings of the stencil only when a squeegee or doctor blade is wiped across the stencil, forcing the slurry into and filling the openings in the stencil. The dimension (l) of each opening could be aligned with the wipe direction. As the wiping operation takes place, the larger dimension (l) overcomes the surface tension of the slurry and retains the measured volume of the slurry, which is to be the volume of the conductive joint member left on the surface after the stencil is removed and after reflowing.

In describing the conductive joint member shape, the terms elliptical and elongated or oval are used. A shape with sharp corners such as a rectangular shape or an elliptical shape with a minor axis so short that parts of the slurry are left in the screen after removal will generally require additional specifications to have it fill reliably in screening. An oval shape may be considered to be a rectangle with semicircular ends, this has an advantage where it is necessary to meet a particular area specification. It is advantageous that the shape be reliably manufacturable by simple screening, that it be elongated so that there is a significant difference between a side to side and an end to end dimension sufficient that in an array where all conductive joint members are aligned, additional interconnection lines can be accommodated in spacing gained, by that difference in dimension. A ratio of a width dimension that is about half that of the length dimension is usually satisfactory. The alignment, of the conductive joint member long dimension with the wipe direction in the screening operation, as the size of the conductive joint member becomes a millimeter or less, permits the surface tension in the slurry of conductive particles being screened to provide a retention component that causes the slurry to be more reliably left on the contact, when the screen is removed, rather than being retained in the screen opening.

In service each conductive joint 1 is fused over the area of the surface 10 to a pad that is one of an array of pads on a superimposed surface mount electronic device, not shown in this FIG. 1. The conductive joint is also fused over the area of the contact 6. The electronic device, usually a semiconductor chip, has different thermal expansion properties from those of plastic wiring support members. In accordance with the invention the elongated shapes of the conductive joints 1 and 2 changes the stress produced by expansion mismatch, thus prolonging the service lifetime until fatigue failure. The stress effect reduction advantages of the invention may be viewed as being able to provide a longer dimension, and in some instances a different location, in the interconnecting interface that can be aligned so as to moderate expansion mismatch induced stresses. This can increase reliability with respect to rigid body fracture failure. Selectively aligning the longer or shorter axis of the conductive joint of the invention with a specific direction of thermal expansion mismatch induced movement will increase lifetime before fracture of the conductive joints. Aligning the longer axis will make the joint more rigid but if the elastic limit of the material is reached, aligning the shorter axis will provide better flexibility of the joint.

Considering a comparison of the bending stress on the connecting interface where one interface is a prism with a round cross section as shown in FIG. 5A and the other interface is a prism that has an elliptical or elongated cross section as shown in FIGS. 5B and 5C, in order to compare the cross sectional area shape effect, the two connecting interfaces have the same amount of cross section area (A), the same height (H), and the same force (F), applied at one end of the interface perpendicular to the axes of the interfaces.

For a prismatic beam of any shape, the bending stress, (sigma), usually designated by (σ), would be in accordance with the relationship expressed in equation 1.

$$\text{sigma}(\sigma) = \frac{MZ}{I} \qquad \text{Equation 1}$$

where: M is the bending moment at the selected location of the element,
Z is the distance from the neutral axis to the selected location, and,
I is the area moment of inertia with respect to a neutral axis.

The highest bending stress (σ) will occur in the interfacing planes where the element interfaces with the planar substrate (the contact location on the printed wiring member and the pad on the chip) and at the point where the material of the joint is farthest from a neutral axis.

In consideration of the types of cross sections, the distance where the material of a joint is farthest from a neutral axis is referred to as R.

With respect to either the circular cross section or the elongated cross section, the bending moment (M) at the point in question would be in accordance with the relationship expressed in equation 2.

$$M = H \; F \qquad \text{Equation 2}$$

The area moment of inertia (I) would be in accordance with the relationship expressed in equation 3.

$$I_i = \frac{\pi R^4}{4} \qquad \text{Equation 3}$$

For the circular cross section
The occurrence of maximum fiber stress (σ) would be at Z max in accordance with the relationship expressed in equation 4.

$$Z\max = R \qquad \text{Equation 4}$$

Therefor sigma max would be in accordance with the relationship expressed in equation 5.

$$\text{sigma max}_1 \; (\sigma_{\max}) = \frac{4HF}{\pi R^3} \qquad \text{Equation 5}$$

The cross sectional area ($A_1$) would be in accordance with the relationship expressed in equation 6.

$$\text{area } A_1 = \pi R^3 \qquad \text{Equation 6}$$

For the elliptical cross section where x—x in FIG. 5A is the neutral axis the bending area moment of inertia I would be in accordance with the relationship expressed in equation 7.

$$I_2 = \frac{\pi a^3 b}{4} \qquad \text{Equation 7}$$

Therefor sigma max would be in accordance with the relationship expressed in equation 8.

$$\sigma\max_2 = \frac{4HF}{\pi a^2 b} \qquad \text{Equation 8}$$

The cross sectional area ($A_2$) would be in accordance with the relationship expressed in equation 9.

$$\text{area } A_2 = \pi ab \qquad \text{Equation 9}$$

The ratio of the maximum bending stress for the two different cross sectional shapes is in accordance with the relationship expressed in equation 10.

$$\frac{\sigma\max_2}{\sigma\max_1} = \frac{R^3}{a^2 b} \qquad \text{Equation 10}$$

Since the cross sectional areas A and A are assumed to be equal then the relationships may be expressed as in equations 11 and 12.

$$\pi R^2 = ab \qquad \text{Equation 11}$$

$$R^2 = ab \qquad \text{Equation 12}$$

Therefor the relationship will follow that expressed in equation 13.

$$\frac{\sigma\max_2}{\sigma\max_1} = \frac{R}{a} \qquad \text{Equation 13}$$

For the two shapes to have equal areas the relationship a>R>b is met so that if the major width of the elliptical or elongated shape is in a direction of a given force, the bending stress of the elliptical or elongated shape will be reduced to that of the round shape by the ratio R/a.

Figure 11:
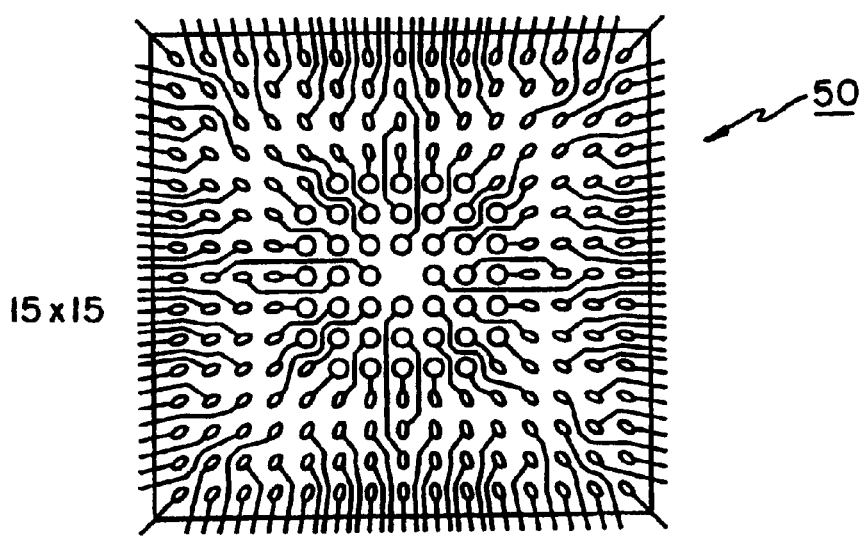

A practical value of R/a is approximately 0.7, therefor if the elliptical or elongated pads are laid out radially as illustrated in FIG. 11 the maximum bending stress can be reduced by about 30%.

In FIGS. 6A to 6F there is shown in column B the comparative benefit in the number of interconnecting lines that can be positioned between conductive joints and aligned parallel to the long axis of the elongated conductive joints of the invention in comparison with similar size circular prior art type conductive joints in column A. In accordance with the invention the expansion mismatch accommodation aspect being handled separately as a separate portion of the interface relaxes specifications, permits more wiring and more resilient conductive joints.

In these examples the interconnecting line width is 75 micrometers and the minimum space between interconnecting lines, or between an interconnecting line and a contact or pad, is 100 micrometers. In column A the size, pitch and wiring spacing for the prior art circular conductive joints are shown. In column B the spacing between elongated conductive joints is illustrated with the conductive joints having a major to minor axis ratio of approximately 2.0.

It is observed that in most wiring configurations, changing from the circular conductive joint to the elongated conductive joint of the invention with the same area, but with a ratio of major to minor axis of roughly 2.0, results in an extra interconnecting line being accommodated in the increased available space between some conductive joints. The interconnecting lines that will be accommodated will vary with the size that is selected for the conductive joint.

Referring to FIG. 6A, there is described in column A a standard prior art circular configuration of 600 micrometer diameter balls, 500 micrometer diameter conductive joints, at a 1000 micrometer pitch, which specifications provide a 0.5 millimeter spacing between conductive joints in both orthogonal directions, which spacing in turn permits two interconnecting lines between adjacent conductive joints in each direction. In comparison, occupying essentially the same area as the configuration in column A, there is described in column B, an example layout of the elongated conductive joints of the invention; with a major to minor axis ratio of 2.0, a spacing between joints in a direction aligned with the major axis of the elongated conductive joints of 0.3 millimeters, and with a spacing between joints aligned with the minor axis of the elongated conductive joints of 0.64 millimeters, which configuration accommodates three interconnecting lines between conductive joints in one direction and one interconnecting line between conductive joints in the other orthogonal direction.

In FIG. 6B there is illustrated the reduced number of the same width interconnecting lines that are accommodated with reduced conductive joint sizes but with more in the direction aligned with the major axis. Referring to FIG. 6B, there is described in column A a standard prior art circular configuration of 500 micrometer diameter balls, 450 micrometer diameter conductive joints, at a 800 micrometer pitch, which specifications provide a 0.35 millimeter spacing between conductive joints in both orthogonal directions, which spacing in turn for such a small size permits a single interconnecting line between adjacent conductive joints in each direction. In comparison, occupying essentially the same area as the configuration in column A, there is described in column B, an example layout of the elongated conductive joints of the invention; with a major to minoraxis ratio of 2.0, a spacing between joints in a direction aligned with the major axis of the elliptical conductive joints of 0.17 millimeters, and with a spacing between joints aligned with the minor axis of the elliptical conductive joints of 0.48 millimeters, which configuration accommodates two interconnecting lines between conductive joints in one direction and no interconnecting line between conductive joints in the other orthogonal direction.

In certain selections of pitch and conductive joint size, while there may be no change in the number of interconnection lines, or even a reduction, that can be accommodated by changing from circular to elongated, still the use of elongated conductive joints provides an advantage in that a wider line may be permitted in the larger space between conductive joints. Such a situation is illustrated in FIG. 6C.

Referring to FIG. 6C, there is described in column A a standard prior art circular configuration of 500 micrometer diameter balls, 350 micrometer diameter conductive joints, at a 800 micrometer pitch, which specifications provide a 0.45 millimeter spacing between conductive joints in both orthogonal directions, which spacing in turn for such a size permits two interconnecting lines between adjacent conductive joints in each direction. In comparison, occupying essentially the same area as the configuration in column A, there is described in column B, an example layout of the elliptical conductive joints of the invention; with a major to minor axis ratio of 2.0, a spacing in a direction aligned with the major axis of the elliptical conductive joints of 0.31 millimeters, and with a spacing aligned with the minor axis of the elongated conductive joints of 0.55 millimeters, which configuration accommodates two interconnecting lines between conductive joints in one direction and only one interconnecting line between conductive joints in the other orthogonal direction. There is however room to use a wider than 100 micrometer interconnecting line, where useful.

In using the elongated conductive joint of the invention it is possible to provide and thus accommodate a wider conductor between rows of conductive joints. The situation is illustrated in FIG. 6D.

Referring to FIG. 6D, there is described in column A a standard prior art circular configuration of 400 micrometer diameter balls, 350 micrometer diameter conductive joints, at a 650 micrometer pitch, which specifications provide a 0.3 millimeter spacing between conductive joints in both orthogonal directions, which spacing in turn for such a size permits two interconnecting lines between adjacent conductive joints in each direction. In comparison, occupying essentially the same area as the configuration in column A, there is described in column B, an example layout of the elliptical conductive joints of the invention; with a major to minor axis ratio of 2.0, a spacing in a direction aligned with the major axis of the elliptical conductive joints of 0.16 millimeters, and with a spacing aligned with the minor axis of the elliptical conductive joints of 0.4 millimeters, which configuration accommodates a single interconnecting line between conductive joints in one direction and no interconnecting line between conductive joints in the other orthogonal direction. There is however, in the 0.4 separation, room to use a much wider than the standard 100 micrometer interconnecting line, where useful.

Advantages can be gained by using smaller conductive joint sizes. Referring to FIG. 6E, there is described in column A a standard prior art circular configuration of 300 micrometer diameter balls, 250 micrometer diameter conductive joints, at a 650 micrometer pitch, which specifications provide a 0.4 millimeter spacing between conductive joints in both orthogonal directions. In comparison, occupying essentially the same area as the configuration in column A, there is described in column B, an example layout of the elongated conductive joints of the invention; with a major to minor axis ratio of 2.0, a spacing in a direction aligned with the major axis of the elongated conductive joints of 0.3 millimeters, and with a spacing aligned with the minor axis of the elongated conductive joints of 0.47 millimeters. Thus with the 650 micrometer pitch, the prior art configuration can have one interconnection line in each direction in the 0.4 millimeter space between the 250 micrometer circular conductive joints whereas in contrast two interconnecting lines can be positioned in the increased 0.47 millimeter space where the conductive joints of the invention have ellongated shapes with a major axis of 350 micrometers and a minor axis of 180 micrometers.

In a situation where very small conductive joints are used, there will still be space enough for an interconnect line with the elongated conductive joints, whereas none can be accommodated with the circular conductive joints. In FIG. 6F, there is described in column A a standard prior art circular configuration of 300 micrometer diameter balls, 250 micrometer diameter conductive joints, at a 500 micrometer pitch, which specifications provide a 0.25 millimeter spacing between conductive joints in both orthogonal directions, which spacing will not accommodate interconnecting lines where the conductive joints are circular. In comparison, occupying essentially the same area as the configuration in column A, there is described in column B, an example layout of the elongated conductive joints of the invention; with a major to minor axis ratio of 2.0, a spacing in a direction aligned with the major axis of the elongated conductive joints of 0.15 millimeters, and with a spacing aligned with the minor axis of the elongated conductive joints of 0.32 millimeters, which configuration accommodates one interconnecting lines between conductive joints.

Figure 7:
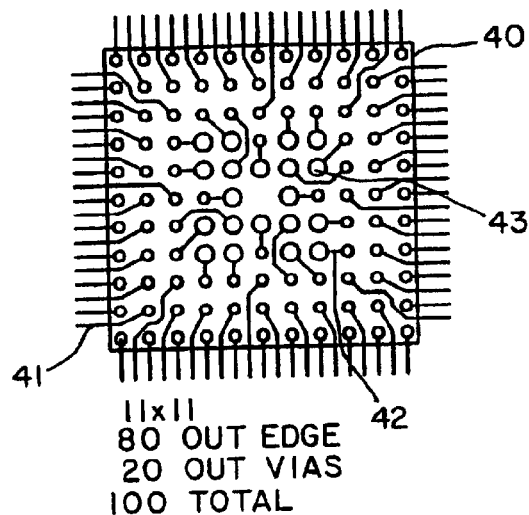
Figure 8:
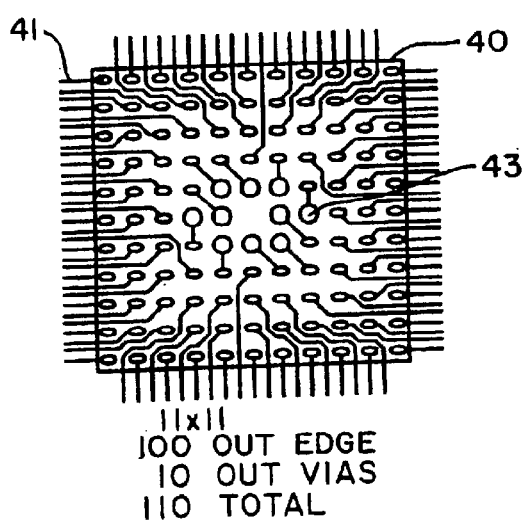
Figure 9:
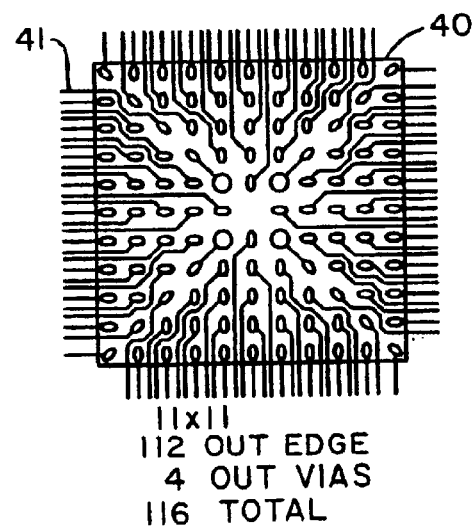

Referring to FIGS. 7–9 there is depicted in FIGS. 8 and 9, two layout geometry embodiments of the invention illustrating wirability advantages as compared with a comparable prior art layout illustrated in FIG. 7. In each of FIGS. 7–9 the spacing is that of FIG. 6E. An interconnecting line width of 75 micrometers and a spacing between lines of 100 micrometers is maintained. The arrangements of elongated conductive joints accommodate any thermal expansion mismatch.

In the prior art illustration in FIG. 7, there is shown a square array of 11×11 conductive joints at the periphery 40, with reduced density of a few conductive joints at the center of the array in the region of the larger diameter via connections. The prior art array can be connected to at most 100 external locations of which 80 are printed fan out lines 41 across the peripheral edges 40 and the remainder are achieved through using fan in lines 42 and vias 43 to wiring planes below the visible one in FIG. 7.

A first embodiment comparison layout is provided in FIG. 8, in which the elongated conductive joints of the invention are all aligned the same way. The wirability is much improved in that 100 printed lines cross the peripheral edges 40 and only 10 leave through vias 43, for a total of 110 external connections.

A second embodiment comparison is provided in FIG. 9, in which the major axis of the elongated joints of the invention are oriented toward the center of the array. The major elongated joint dimension orientation is at 0 degrees, 45 degrees or 90 degrees to a geometric axis that passes through the center thus accommodating thermal expansion mismatch.

The wirability is superior in several ways. A larger number, 116, external connections can be made; of those, 112 are lines that fan directly out across the peripheral edges 40 while only 4 require vias. Fanning directly out requires a simpler wiring technology than using vias.

The wiring and expansion stress benefits of the invention in comparison to the prior art are further illustrated in connection with FIGS. 10 and 11 in which for a comparable geometric layout and spacing as described in connection with FIG. 6E, a comparison is made between the layout of FIG. 10 as representative of the prior art and that of the invention in the higher wiring density embodiment of FIG. 11.

Figure 10:
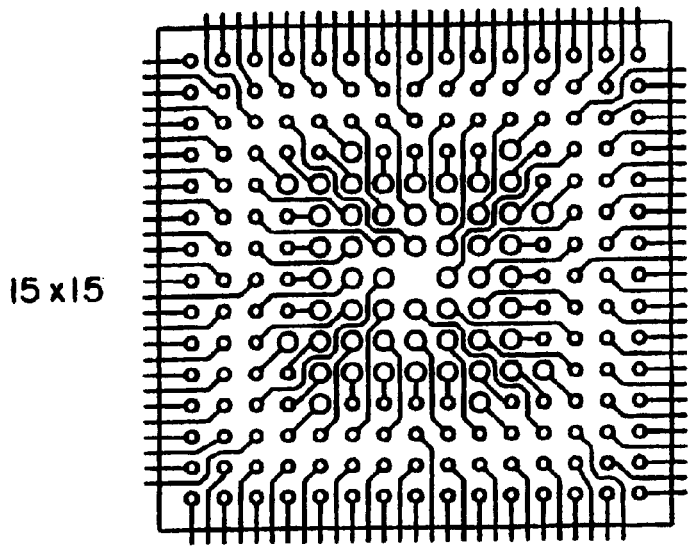

In the prior art structure of FIG. 10, in a 15×15 array of circular conductive joints, with lines oriented both toward the center of the array and perpendicular to the edges, the layout provides 112 direct fan out lines and 56 vias are required, for a total of 168. In comparison in FIG. 11 a comparable 15×15 array is provided with the elongated conductive joints and diagonal expansion mismatch joint orientation of the invention at every contact except the vias and with the long axis of the vias oriented toward the center of the array.

The wiring layout is again superior in that there is provided a greater number, 135, of direct fan out lines and a reduced number, 44, of vias for a larger total of 176 external connections.

The thermal expansion mismatch accommodation advantage of the invention is further illustrated in the embodiment of FIG. 11. As the module 50, comprising at least the assembly of the device with many pads conductively joined to a printed circuit with many contact locations; expands and contracts with respect to the individual parts, where the conductive joints are the elongated shape of the invention, the long axis of the conductive joints are aligned to oppose the induced stresses in the conductive joints. This can increase the reliability of the interconnection if the failure is rigid body fracture. Rotating the major axis of all elongated contacts to a direction that is 90 degrees to that of the elongated contacts shown in FIG. 11 would result in the minor or narrower axis of the elongated conductive joints being aligned with the largest thermally induced movement which will result in increased reliability if the stresses in the conductive joints can be reduced below the fracture limit.

What has been described is an array contacting interface wherein the use of an elongated shaped conductive joint members together in a contacting portion and in a thermal expansion mismatch accommodation portion benefits are achieved in wireability, uniformity, reliability and service lifetime.

What is claimed is:

1. In an array of conductive joints between signal pads on a surface of an integrated circuit member of a material having a first thermal responsiveness and corresponding contacts on an aligned wiring support member of a material having a second thermal responsiveness, the improvement comprising:

an interface having first and second portions, said first portion of said interface containing an array of elongated conductive joint members, each having a contacting area made up of a length contacting dimension and a width contacting dimension and with said length contacting dimension being longer than said width dimension, and, said second portion of said interface having a contacting area approximating the contacting area of said conductive joint members of said first portion, being so positioned to accommodate expansion mismatch stresses in said conductive joint members, being at least one contacting area positioned orthogonally with respect to said common aligned direction, and being an elongated contact in contact with said surface and a circular contact in contact with said wiring support for each member of said array.

2. The improvement of claim 1 wherein said second portion of said interface is a contacting area taken from the group of:

contact areas to the surface to which said conductive joints are attached, alternate conductive joint members attached to said wiring support member; and, elongated and circular contacts at opposite ends of each conductive joint with said elongated contact at said surface and said circular contact in contact with said wiring support.

3. The improvement of claim 1 wherein said second portion of said interface is an elongated contact in contact with said surface having major and minor essentially perpendicular axes and a circular contact having a radius in contact with said wiring support member for each member of said array.

4. The improvement of claim 3 wherein the bending stress resistant value of said second portion of said interface is a ratio of said radius value over said minor axis value.

5. An improvement in an array of conductive joints between signal pads on a surface of an integrated circuit member of a material having a first thermal responsiveness and corresponding contacts on an aligned wiring support member of a material having a second thermal responsiveness, Comprising in combination:

an interface between said pads and said contacts having first and second portions, said first portion of said interface containing an array of elongated conductive joint members, each having a contacting area made up of a length contacting dimension and a width contacting dimension and with said length contacting dimension being longer than said width dimension, Said array of conductive joint members being oriented with said length contacting length dimension in a common direction, and, said second portion of said interface having a contacting area approximating the contacting area of said conductive joint members of said first portion, being so positioned to accommodate expansion mismatch stresses in said conductive joint members, being at least one contacting area positioned orthogonally with respect to said common direction, and is an elongated contact in contact with said surface and a circular contact in contact with said wiring support for each member of said array.

6. The improvement of claim 5 wherein said second portion of said interface is a contacting area taken from the group of: contact areas to the surface to which said conductive joints are attached, alternate conductive joint members attached to said wiring support member; and, elongated and circular contacts at opposite ends of each conductive joint with said elongated contact at said surface and said circular contact in contact with said wiring support.

7. The improvement of claim 6 wherein said second portion of said interface is an elongated contact in contact with said surface having major and minor essentially perpendicular axes and a circular contact having a radius in contact with said wiring support member for each member of said array.

8. The improvement of claim 7 wherein the bending stress resistant value of said second portion of said interface is a ratio of said radius value over said minor axis value.

* * * * *